United States Patent
Teranishi et al.

(10) Patent No.: US 9,797,926 B2
(45) Date of Patent: Oct. 24, 2017

(54) CONTACT AND ELECTRICAL CONNECTION TESTING APPARATUS USING THE SAME

(71) Applicant: OMRON Corporation, Kyoto-shi, Kyoto (JP)

(72) Inventors: Hirotada Teranishi, Osaka (JP); Takahiro Sakai, Shiga (JP)

(73) Assignee: OMRON Corporation, Kyoto (JP)

( * ) Notice: Subject to any disclaimer, the term of this patent is extended or adjusted under 35 U.S.C. 154(b) by 116 days.

(21) Appl. No.: 14/440,549

(22) PCT Filed: Oct. 22, 2013

(86) PCT No.: PCT/JP2013/078589
§ 371 (c)(1),
(2) Date: May 4, 2015

(87) PCT Pub. No.: WO2014/073368
PCT Pub. Date: May 15, 2014

(65) Prior Publication Data
US 2015/0276808 A1    Oct. 1, 2015

(30) Foreign Application Priority Data
Nov. 7, 2012  (JP) ................................. 2012-245548

(51) Int. Cl.
*G01R 1/06* (2006.01)
*G01R 1/067* (2006.01)
(Continued)

(52) U.S. Cl.
CPC ....... *G01R 1/06727* (2013.01); *G01R 1/0466* (2013.01); *H01R 13/2407* (2013.01); *G01R 1/06716* (2013.01)

(58) Field of Classification Search
USPC ........ 324/755.07, 756.02, 538; 439/591, 259
See application file for complete search history.

(56) References Cited

U.S. PATENT DOCUMENTS 4,445,735 A * 5/1984 Bonnefoy ............ H01R 12/714
                                                        439/591
6,794,890 B1    9/2004 Tokumo et al.
(Continued)

FOREIGN PATENT DOCUMENTS

JP    2001-083179 A    3/2001
JP    2001-102141 A    4/2001
(Continued)

OTHER PUBLICATIONS

Extended European Search Report in counterpart European Application No. 13854119.8 issued Jun. 16, 2016 (8 pages).
(Continued)

*Primary Examiner* — Vincent Q Nguyen
(74) *Attorney, Agent, or Firm* — Osha Liang LLP

(57) ABSTRACT

A contact terminal has a support section that holds an elastically deformable axle so as to rotate about the axle with an elastic deformation of the axle, and a contact section extending from the support section. The contact section has, at a distal end thereof, a contact portion configured to make a contact with a testing element. The contact section deforms elastically while rotating with the support section by the contact of the contact portion with the testing element.

9 Claims, 4 Drawing Sheets

(51) Int. Cl.
  *H01R 13/24*   (2006.01)
  *G01R 1/04*   (2006.01)

(56)     References Cited

U.S. PATENT DOCUMENTS

| | | |
|---|---|---|
| 7,422,457 B1 | 9/2008 | Wu |
| 7,449,906 B2 | 11/2008 | Miura et al. |
| 7,589,547 B2 | 9/2009 | Ismail |
| 2009/0035960 A1 | 2/2009 | Osato et al. |
| 2009/0104795 A1 | 4/2009 | Osato et al. |
| 2009/0298315 A1* | 12/2009 | Iida ................ H01R 12/79 |
| | | 439/259 |
| 2010/0081336 A1 | 4/2010 | Hemmi et al. |

FOREIGN PATENT DOCUMENTS

| | | |
|---|---|---|
| JP | 2002-246128 A | 8/2002 |
| JP | 2008-157800 A | 7/2008 |
| JP | 2009-103563 A | 5/2009 |
| JP | 2010-118220 A | 5/2010 |
| TW | M351497 U | 2/2009 |
| TW | I333072 B | 11/2010 |

OTHER PUBLICATIONS

International Search Report issued in PCT/JP2013/078589 mailed on Feb. 4, 2014 (4 pages).
Search Report issued in corresponding application No. TW 102138996 (1 page), Nov. 7, 2012.

\* cited by examiner

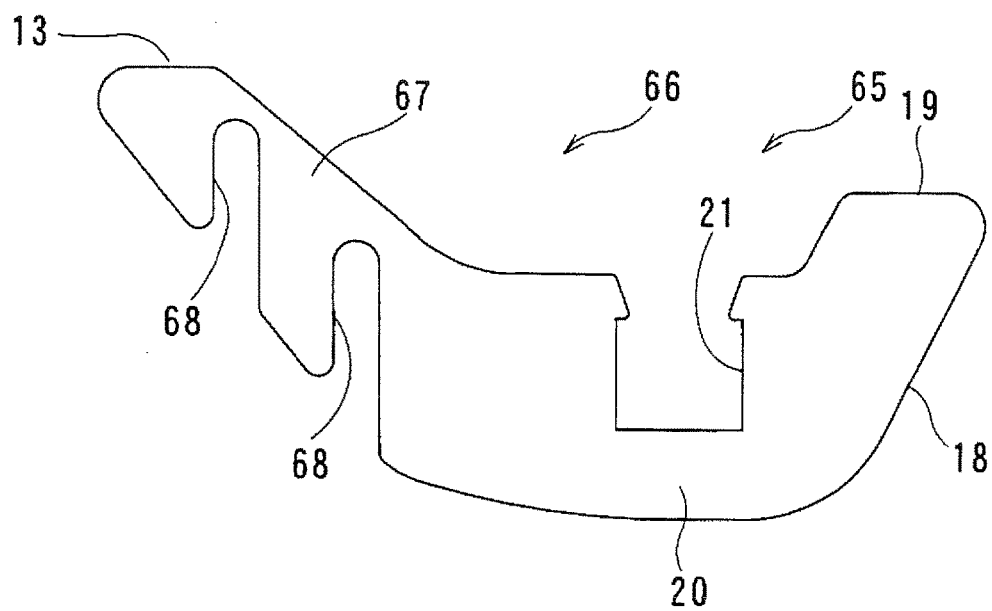
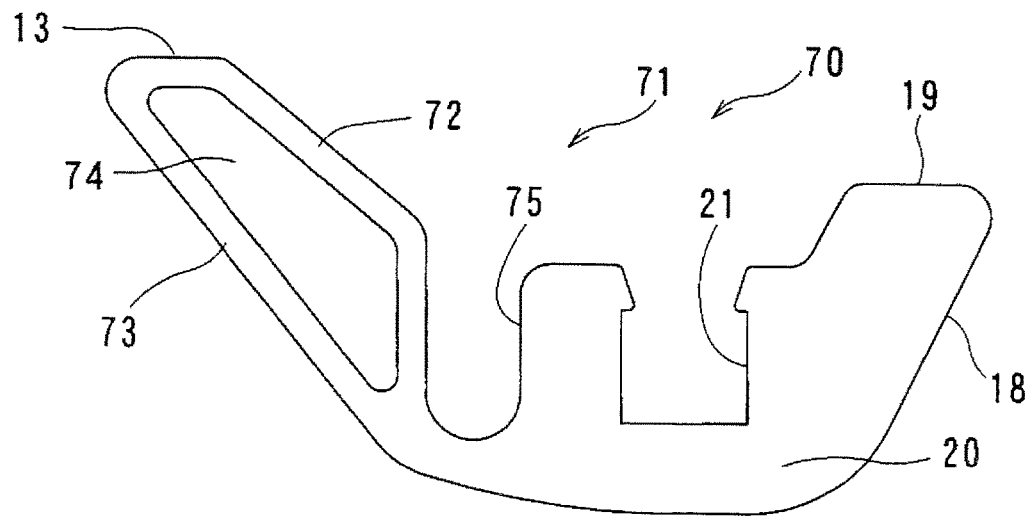

CONTACT AND ELECTRICAL CONNECTION TESTING APPARATUS USING THE SAME

BACKGROUND

Technical Field

The present invention relates to a contact which is designed to detect an object through a soft contact therewith and an electrical connection testing apparatus using the contact.

Related Art

There has been disclosed in, for example, Patent Document 1, a contact for electrically connecting electric component. According to the arrangement, the contact is supported by a needle holder within a housing so that, when a distal end of the contact is forced by the contact with an associated electrode of the object, it swings about the needle holder to compressively deform the needle holder. During the swing, the distal end of the contact makes a frictional contact with the associated electrode to remove the oxidized film generated on the electrode, reducing an electrical resistance between the contact and the associated electrode to establish a reliable electrical contact therebetween.

Also, Patent Document 2 discloses another arrangement in which a rigid contact is supported by elastic members so that a displacement of the contact caused by the contact with a semiconductor device is accommodated by the compressive deformation of the elastic members.

In either event, the disclosed contact is made of rigid material and therefore not elastically deformable, which may scrape and damage the contact of the testing member. Also, the rigidity of the contact may allow only a small dimensional tolerance. Therefore, when assembled in a testing device, the contact force may be unstable, which may result in an unreliable contact with the testing member.
Patent Document 1: JP 2009-103563 A
Patent Document 2: JP 2010-118220 A

SUMMARY

One or more embodiments of the present invention provides a contact which has a suitable elasticity and therefore is unlikely to damage the contacting member and which is capable of making a reliable contact. One or more embodiments of the present invention provides an electrical connection testing apparatus using the contact A contact terminal according to one or more embodiments of the invention has a support section for holding an elastically deformable axle so as to rotate about the axle with an elastic deformation of the axle; a contact section extending from the support section, the contact section having at a distal end thereof a contact portion capable of making a contact with a testing element; wherein the contact section is designed to deform elastically as it rotates with the support section by the contact of the contact portion with the testing element.

According to this arrangement, the contact section may deform elastically, which prevents the contact section from damaging the testing element. Also, the contact terminal is made of elastic material, which may improve a contact reliability, compared to that made of rigid material.

The contact section may have the contact portion, a first arm extending from the support section toward one end of the contact portion, and a second arm extending from the support section toward the other end of the contact portion, wherein the contact portion, the first arm, and the second arm form an opening thereinside.

According to this arrangement, the existence of the opening formed by the first and second arms improves the elastic deformability of the contact section.

The contact section may have the contact portion, a first arm extending from the support section toward one end of the contact portion, a second arm extending from the support section toward the other end of the contact portion, and an intermediate arm extending from the support section toward the contact portion to form an opening between the first arm and the intermediate arm and between the second arm and the intermediate arm.

According to this arrangement, the openings formed between the first arm and the intermediate arm and between the second arm and the intermediate arm improves elastic deformability of the contact section and supporting strength of the contact portion.

The contact section may have a first elastic arm extending from the support section toward one end of the contact portion; and a second elastic arm extending from the support section and along the first elastic arm to define a slot between the first and second elastic arms.

According to this arrangement, the downward movement of the contact portion causes rotations of the first and second elastic arms and an elastic deformation of the second elastic arm. The existence of the slot improves the elastic deformations of the first and second elastic arms.

The contact section may have a first elastic arm extending from the support section toward one end of the contact portion; a second elastic arm extending from the support section and along the first elastic arm to define a slot between the first and second elastic arms; and a third elastic arm extending from the support section and along the second elastic arm to define a slot between the second and third elastic arms.

According to this arrangement, the downward movement of the contact portion causes rotations of the support section and the first to third elastic arms and elastic deformations of the first to third elastic arms. The existence of the slots between the first and second elastic arms and between the second and third elastic arms improves the elastic deformations of the first to third elastic arms.

The contact section may have an elastic arm extending from the support section toward the contact portion, the elastic arm having a proximal portion including a U-shaped vertical slot defined therein. This arrangement improves an elastic deformation of the elastic arm.

The contact section may have an elastic arm extending from the support section toward the contact portion, the elastic arm having two inverse U-shaped slots defined therein to extend vertically from an outer periphery of the elastic arm. This arrangement improves an elastic deformation of the elastic arm.

The contact section may have a first arm extending from one end of the contact portion; and a second arm extending from the other end of the contact arm, the second arm being bent toward the first arm to form an opening between the first and second arms; wherein the second arm defines a U-shaped slot between the second arm and the support section. This arrangement improves an elastic deformation of the first and second arms.

An electrical connection testing apparatus comprises a fixed contact; an elastically deformable axle; and a contact terminal having a support section and a contact section extending from the support section, the support section holding the axle so as to rotate about the axle, and the contact section having at a distal end thereof a contact portion capable of making a contact with a testing element; wherein a forcing contact of the testing element with the contact portion allows a rotation of the contact terminal to make an electrical contact between the contact terminal and the fixed contact as the contact section deforms elastically.

This arrangement prevents the contact section from damaging the testing element. Also, an electrical connection testing apparatus is obtained in which the contact terminal is made of elastic material and therefore a contact reliability is improved, compared to that made of rigid material.

BRIEF DESCRIPTION OF DRAWINGS

FIG. 6 is a front view of the contact terminal according to the sixth embodiment; and FIG. 7 is a front view of the contact terminal according to the seventh embodiment.

DETAILED DESCRIPTION

Figure 1A:
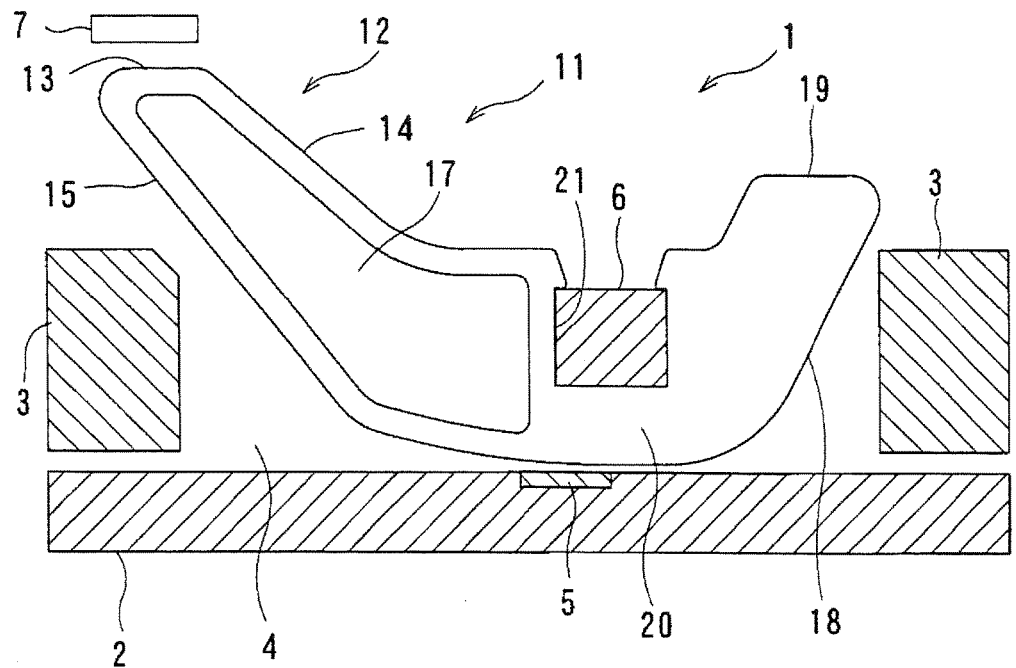
FIGS. 1A and 1B are front views of pre-deformed and post-deformed electrical connection testing apparatus including a contact terminal according to the first embodiment.

With reference to the accompanying FIGS. 1A, 1B to 7, embodiments of the invention will be described below. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. As shown in FIG. 1A, the contact terminal generally indicated by reference number 11 according to the first embodiment of the invention is illustrated as it is assembled in an electrical connection testing apparatus generally indicated by reference number 1. The electrical connection testing apparatus 1 has a testing substrate 2 forming a bottom portion thereof, and has surrounding side walls 3 extending upward from the testing substrate 2 to define a contact cavity 4 thereinside. A fixed contact 5 is embedded in the surface of the testing substrate 2.

The electrical connection testing apparatus 1 is configured so that a testing element 7 forces the distal end of the contact terminal 11 on the testing substrate 2 to rotate the contact terminal 11 about an axle 6 described below, allowing the bottom portion of the contact terminal 11 to make a contact with the fixed contact 5 of the testing substrate 2 and thereby establish an electrical connection between the testing element 7 and the testing substrate 2 to detect the testing element 7.

The contact terminal 11, which is made of a plate member, is supported for rotation within the contact cavity 4. Specifically, the contact terminal 11 has a contact section generally indicated by reference number 12 which is movable and elastically deformable by the contact with the testing element 7 and a support section 20 which is holds the axle 6 so that the support section 20 together with the contact section 12 rotates about the axle 6.

The loop-like or annular contact section 12 has a contact portion 13 positioned to make a contact with the testing element 7, an upper arm 14 extending from an upper portion of the support section 20 to one end of the contact portion 13, and an lower arm 15 extending from a lower portion of the support section 20 to the other end of the contact portion 13. The upper arm 14 extends horizontally from the upper portion of the support section 20 and then obliquely upward toward the inner end of the contact portion 13. The lower arm 15 extends obliquely upward from the lower portion of the support section 20 at an angle less than that of the upper arm 14 and then is bent to extend obliquely upward at an angle greater than that of the upper arm 14 toward the outer end of the contact portion 13. As described above, the contact portion 13 is connected with the support section 20 through the upper arm 14 and the lower arm 15 to define an opening 17 in the contact section 12. As can be seen from the drawing, the support section 20 is substantially U-shaped to define a concave portion 21 which extends downward from an upper periphery of the support section 20.

When assembling the electrical connection testing apparatus 1, the contact terminal 11 is positioned within the contact cavity 4 with the concave portion 21 fitted around the elastically deformable axle 6, which allows the contact terminal 11 to be supported for rotational or swinging movement with the torsional movement of the axle 6.

Figure 1B:
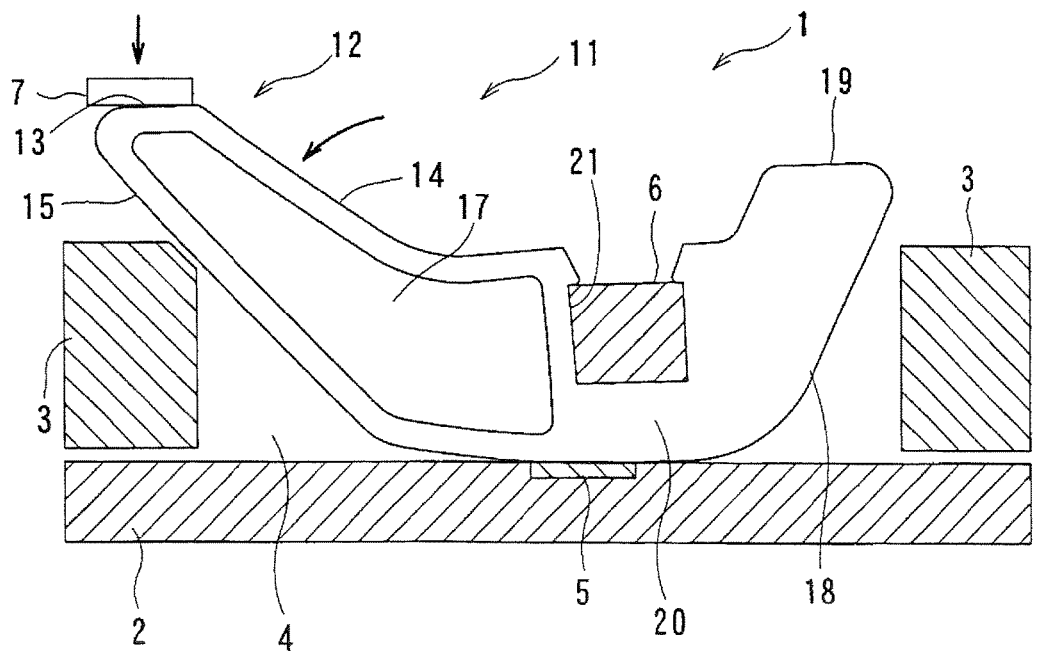

Specifically, when the testing element 7 moves downward to force the contact portion 13 of the contact terminal 11 downward, the contact section 12 and the support section 20 rotate in the counterclockwise direction in FIG. 1B about the axle 6 as the axle 6 makes a torsional, elastic deformation thereof, allowing the bottom portion of the support section 20 to contact with the fixed contact 5 of the testing substrate 2. Then, the upper arm 14 and the lower arm 15 deform elastically until the lower arm 15 abuts the side wall 3, which halts the rotational movement of the contact terminal 11. This results in an electric connection between the testing element 7 and the fixed contact 5 through the contact terminal 11, allowing the existence of the testing element 7 to be detected. Then, when the downward force on the contact portion 13 of the contact terminal 11 is removed, the torsionally deformed axle 6 moves back into its original position to rotate the support section 20 in the clockwise direction, which breaks the electrical connection between the bottom portion of the support section 20 and the fixed contact 5 of the testing substrate 2.

As described above, forcing the testing element 7 against the contact terminal 11 allows the rotation of the contact section 12 to cause the elastic deformations of the upper arm 14 and the lower arm 15, which ensures a soft or damping contact of the testing element 7 and, as a result, prevents the testing element 7 from being damaged by the contact. Also, the elastic deformation reduces the contact force between the testing element 7 and the contact portion 13. Further, the elasticity of the contact terminal 11 increases a contact reliability than when it is made of rigid material.

Also, according to the first embodiment, a side surface 18 which positions away from the contact portion 13 of the contact terminal 11 is formed to extend obliquely upward from the testing substrate 2 so that the contact terminal 11 takes a substantially arcuate configuration. This causes that, when the contact portion 13 is forced downward, the contact terminal 11 rotates about the axle 6 in the counterclockwise direction to raise the opposite upper surface 19 upward. This means that, if there were a fixed contact above the upper surface 19, a sufficient contact force could be obtained between the fixed contact and the upper surface 19 due to the principle of leverage, which would expand the possibility of design of the electrical connection testing apparatus 1.

Figure 2:
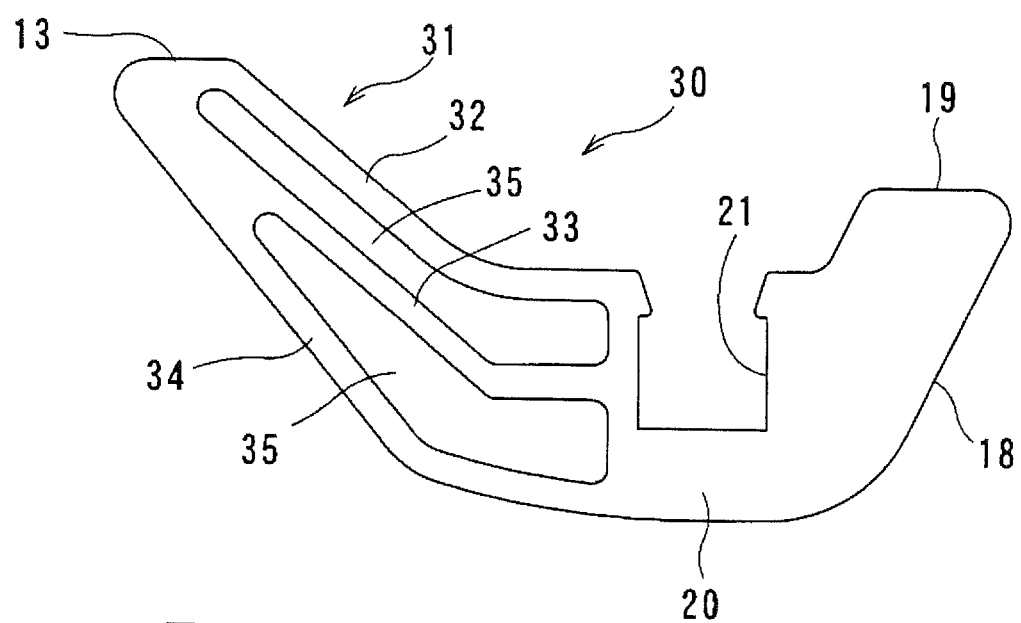
FIG. 2 is a front view of the contact terminal according to the second embodiment.

The contact section 31 of the contact terminal 30 according to the second embodiment of the invention has an upper arm 32 extending from the support section 20 to one end of the contact portion 13, a lower arm 34 extending from the support section 20 to the other end of the contact portion 13, and an intermediate arm 33 extending from the support section 20 to the contact portion 13 so as to define openings 35 between the intermediate arm 33 and the upper and lower arms 32 and 34. Specifically, as shown in FIG. 2, the loop-like or annular contact section 31 has the upper arm 32, intermediate arm 33, and lower arm 34 and is connected to the support section 20 through those arms 32, 33, and 34. In the second embodiment, the upper arm 32 and the intermediate arm 33 extend horizontally from the support section 20 and then obliquely upward toward the contact portion 13. The lower arm 34 extends obliquely upward from the support section 20 with an angle smaller than the obliquely extending portions of the upper arm 32 and the intermediate arm 33 and then is bent so that it extends obliquely upward with an angle greater than those of the upper arm 32 and the intermediate arm 33. As above, the contact portion 13 and the support section 20 are connected through the upper arm 32, intermediate arm 33, and lower arm 34 to define two openings 35 in the contact section 31. Other structures are similar to those described in connection with the first embodiment, and like parts are designated like reference numbers to eliminate duplicate descriptions therefor.

An operation of the contact terminal 30 will be described below. When the testing element 7 moves downward to force the contact portion 13 of the contact terminal 30 downward, the contact section 31 and the support section 20 rotate in the counterclockwise direction in FIG. 2 about the axle 6, which causes a torsional, elastic deformation of the axle 6 and also elastic deformations of the upper arm 32, intermediate arm 33, and lower arm 34. The existence of the openings 35 defined between the upper arm 32 and the intermediate arm 33 and between the intermediate arm 33 and the lower arm 34 allows the elastic deformations of the arms and increases a supporting strength of the contact section 31.

Figure 3:
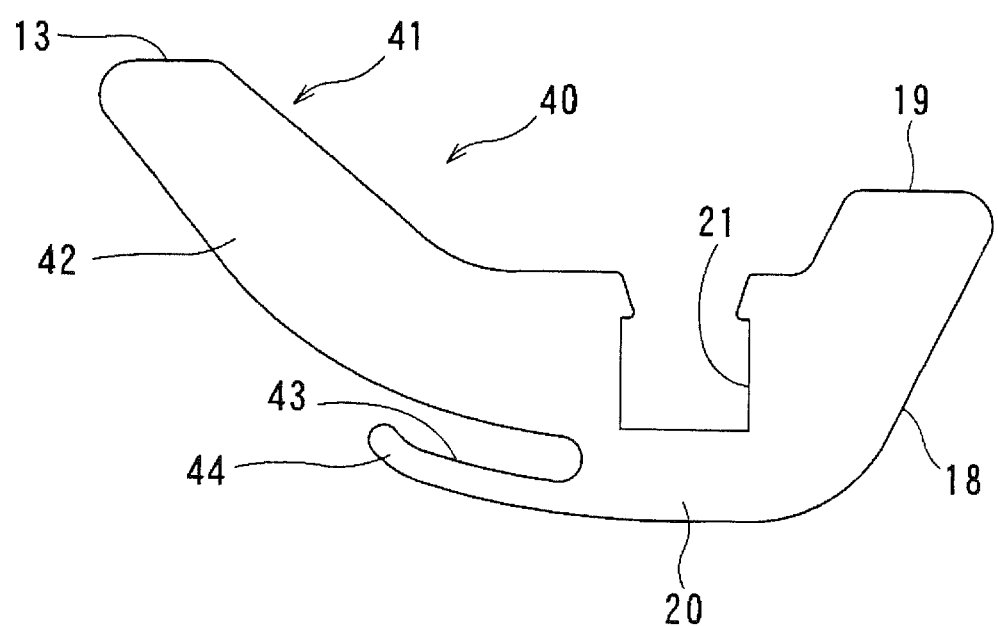
FIG. 3 is a front view of the contact terminal according to the third embodiment.

Referring to FIG. 3, there is shown a contact terminal 40 according to the third embodiment of the invention in which the contact section 41 thereof has a wide and bent, first elastic arm 42 connecting between the contact portion 13 and the support section 20 and a second elastic arm 44. The second elastic arm 44, which is provided below the first elastic arm 42 and beyond a slot 43 defined therebetween, extends obliquely upward from the lower portion of the support section 20 and along the first elastic arm 42. Other structures are similar to those described in connection with the first embodiment, and like parts are designated like reference numbers to eliminate duplicate descriptions therefor.

An operation of the contact terminal 40 will be described below. When the testing element 7 moves downward to force the contact portion 13 of the contact terminal 40 downward, the support section 20, the first elastic arm 42 and the second elastic arm 44 rotate in the counterclockwise direction in FIG. 3 about the axle 6, which causes a torsional, elastic deformation of the axle 6 and also elastic deformations of the first elastic arm 42 and the second elastic arm 44. The existence of the slot 43 defined between the first elastic arm 42 and the second elastic arm 44 enhances the elastic deformations of the first elastic arm 42 and the second elastic arm 44.

Figure 4:
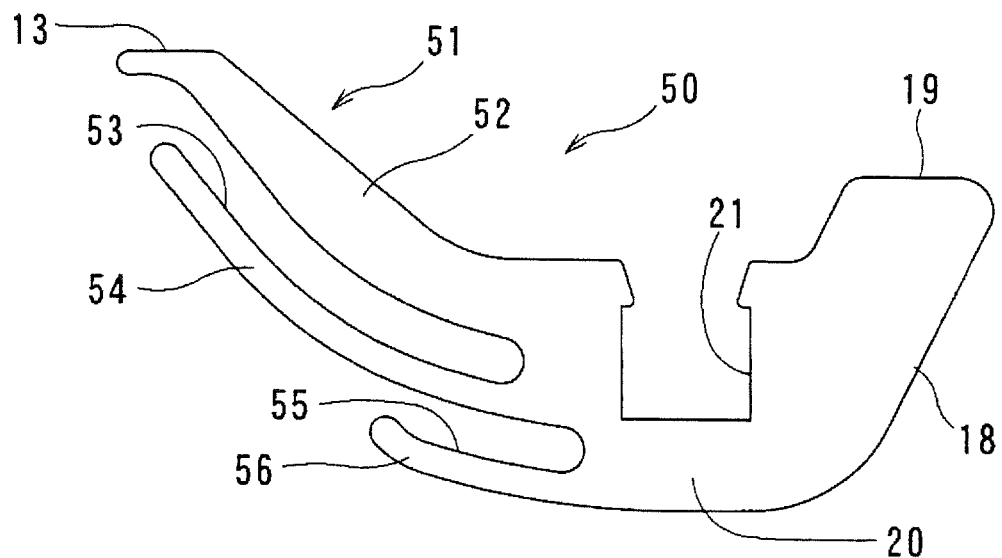
FIG. 4 is a front view of the contact terminal according to the fourth embodiment.

Referring to FIG. 4, there is shown a contact terminal 50 according to the fourth embodiment of the invention in which the contact section 51 has a narrow and bent, first elastic arm 52 connecting between the contact portion 13 and the support section 20, a second elastic arm 54 provided below the first elastic arm 52 and beyond a slot 53 defined therebetween and extending obliquely upward from the support section 20 and along the first elastic arm 52, and a third elastic arm 56 provided below the second elastic arm 54 and beyond a slot 55 defined therebetween and extending obliquely upward from the support section 20. Other structures are similar to those described in connection with the first embodiment, and like parts are designated like reference numbers to eliminate duplicate descriptions therefor.

An operation of the contact terminal 50 will be described below. When the testing element 7 moves downward to force the contact portion 13 of the contact terminal 50 downward, the support section 20, the first elastic arm 52, the second elastic arm 54, and the third elastic arm 56 rotate in the counterclockwise direction in FIG. 4 about the axle 6, which causes a torsional, elastic deformation of the axle 6 and also elastic deformations of the first elastic arm 52, the second elastic arm 54, and the third elastic arm 56. The existence of the slot 53 between the first elastic arm 52 and the second elastic arm 54 and the slot 55 between the second elastic arm 54 and the third elastic arm 56 enhance the elastic deformations of the first elastic arm 52, the second elastic arm 54, and the third elastic arm 56.

Figure 5:
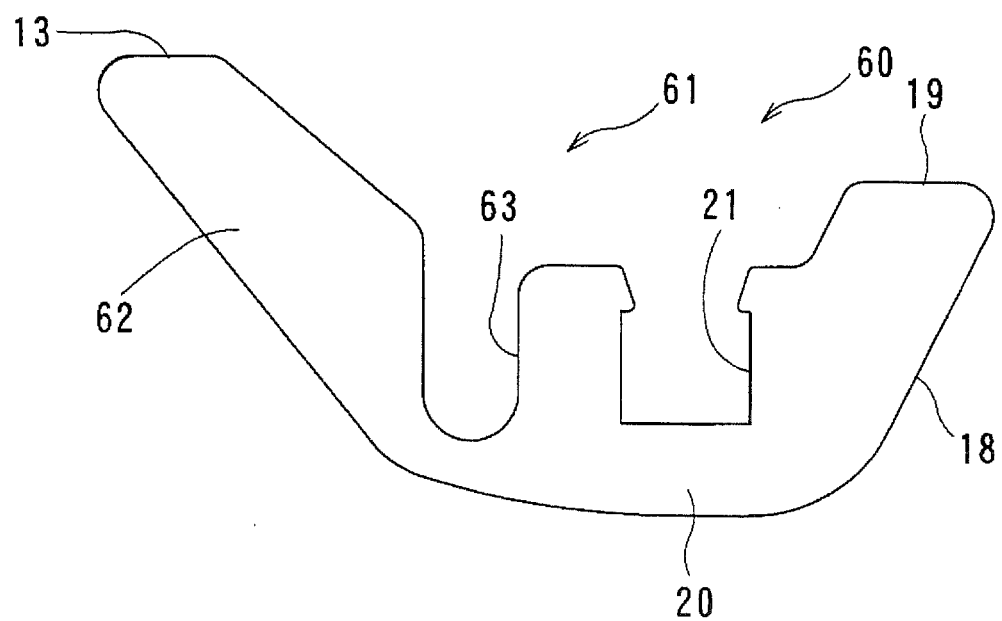
FIG. 5 is a front view of the contact terminal according to the fifth embodiment.

Referring to FIG. 5, there is shown a contact terminal 60 according to the fifth embodiment of the invention in which the contact section 61 has an elastic arm 62 extending linearly and obliquely from the support section 20 toward the contact portion 13. The elastic arm 62 has a U-shaped, vertical slot 63 defined at a proximal end thereof. Other structures are similar to those described in connection with the first embodiment, and like parts are designated like reference numbers to eliminate duplicate descriptions therefor.

An operation of the contact terminal 60 will be described below. When the testing element 7 moves downward to force the contact portion 13 of the contact terminal 60 downward, the support section 20 and the elastic arm 62 rotate in the counterclockwise direction in FIG. 5 about the axle 6 as the elastic arm 62 torsionally deforms elastically and the elastic arm 62 deforms elastically. The existence of the vertical slot 63 in the elastic arm 62 enhances the elastic deformations of the elastic arm 62.

Referring to FIG. 6, there is shown a contact terminal 65 according to the sixth embodiment of the invention in which the contact section 66 of the contact terminal 65 has an elastic arm 67 extending linearly and obliquely from the support section 20 toward the contact portion 13. The elastic arm 67 has two inverse U-shaped, vertical slots 68 extending upward from the lower edge of the elastic arm 67. Other structures are similar to those described in connection with the first embodiment, and like parts are designated like reference numbers to eliminate duplicate descriptions therefor.

An operation of the contact terminal 65 will be described below. When the testing element 7 moves downward to force the contact portion 13 of the contact terminal 65 downward, the support section 20 and the elastic arm 67 rotate in the counterclockwise direction in FIG. 6 about the axle 6 as the elastic arm 67 torsionally deforms elastically and the elastic arm 67 deforms elastically. The existence of the vertical slots 68 in the elastic arm 67 enhances the elastic deformations of the elastic arm 67.

Referring to FIG. 7, there is shown a contact terminal 70 according to the seventh embodiment of the invention in which the contact section 71 of the contact terminal 70 has an upper arm (second arm) 72 extending obliquely downward from one end of the contact portion 13 and then bent vertically downward and a lower arm (first arm) 73 extending obliquely downward from the other end of the contact portion 13. One ends of the upper arm 72 and the lower arm 73, adjacent the support section, are merged with each other to form an opening 74 therebetween. Also, a U-shaped vertical slot 75 is formed between the upper arm 72 and the support section 20. Other structures are similar to those described in connection with the first embodiment, and like parts are designated like reference numbers to eliminate duplicate descriptions therefor.

An operation of the contact terminal 70 will be described below. When the testing element 7 moves downward to force the contact portion 13 of the contact terminal 70 downward, the support section 20 deforms downwardly and also the contact section 71 rotates in the counterclockwise direction in FIG. 7 about the axle 6 as the upper arm 72 and the lower arm 73 deform elastically. The existence of the closed-loop or annular contact section 71 enhances the elastic deformations of the upper arm 72 and the lower arm 73.

Although in one or more of the previous embodiments, the side surface 18 is illustrated to extend obliquely, according to one or more embodiments of the present invention, the side surface may extend vertically, which enhances a possibility of design for the contact terminal 11.

The present invention is not limited to the above-described embodiments and can be modified in various ways.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

1: electrical connection testing apparatus
11: contact (first embodiment)
12: contact section
13: contact portion
14: upper arm (first arm)
15: lower arm (second arm)
30: contact terminal (second embodiment)
31: contact section
32: upper arm (first arm)
33: intermediate arm
34: lower arm (second arm)
40: contact terminal (third embodiment)
41: contact section
42: first elastic arm
43: slot
44: second elastic arm
50: contact terminal (fourth embodiment)
51: contact section
52: first elastic arm
53: slot
54: second elastic arm
55: slot
56: third elastic arm
60: contact terminal (fifth embodiment)
61: contact section
62: elastic arm
63: vertical slot
65: contact terminal (sixth embodiment)
66: contact section
67: elastic arm
68: vertical slot
70: contact terminal (seventh embodiment)
71: contact section
72: upper arm (second arm)
73: lower arm (first arm)
75: vertical slot

The invention claimed is:

1. A contact terminal comprising:
a support section configured to be securely mounted on an axle that is elastically and torsionally deformable about an axis thereof, such that the support section swings about the axis according to an elastic torsional deformation of the axle about the axis; and
a contact section extending from the support section and away from the axle,
wherein the contact terminal is made of electrically conductive material,
wherein the contact terminal is configured to be combined with a circuit substrate having an electric contact formed thereon,
wherein the contact terminal is configured such that, when a testing element is forced thereon, the contact terminal electrically connects the testing element to the electric contact of the circuit substrate due to the elastic torsional deformation of the axle,
wherein the support section comprises a first contact portion,
wherein the contact section comprises a second contact portion configured to have the testing element forced thereon,
wherein the support section is configured such that, when the contact terminal is combined with the circuit substrate, the first contact portion is positioned opposite the electric contact of the circuit substrate with a gap formed therebetween, and
wherein, when the testing element is forced on the second contact portion, the contact terminal swings about the axis of the axle by the elastic torsional deformation of the axle, causing the first contact portion to make contact with the electric contact of the circuit substrate, thereby electrically connecting the testing element and the electric contact of the circuit substrate through the contact terminal.

2. The contact terminal of claim 1,
wherein the contact section comprises a first arm and a second arm, each of which extends between the support section and the second contact portion,
wherein an opening is formed between the first arm and the second arm.

3. The contact terminal of claim 1,
wherein the contact section comprises a first arm, a second arm, and a third arm, each of which extends between the support section and the second contact portion,
wherein the third arm is positioned between the first arm and the second arm,
wherein a first opening is formed between the first arm and the third arm, and
wherein a second opening is formed between the second arm and the third arm.

4. The contact terminal of claim 1,
wherein the contact section comprises
a first elastic arm extending between the support section and the second contact portion, and
a second elastic arm extending from the support section along the first elastic arm, and
wherein a slot is formed between the first elastic arm and the second elastic arm.

5. The contact terminal of claim 1,
wherein the contact section comprises:
a first elastic arm extending between the support section and the second contact portion,
a second elastic arm extending from the support section along the first elastic arm,
a third elastic arm extending from the support section along the second elastic arm,
wherein a first slot is formed between the first elastic arm and the second elastic arm, and
wherein a second slot is formed between the second elastic arm and the third elastic arm.

6. The contact terminal of claim 1,
wherein the contact section comprises an elastic arm extending between the support section and the second contact portion,
wherein the elastic arm comprises a proximal portion adjacent to the support section,
wherein the proximal portion including a U-shaped vertical slot defined therein.

7. The contact terminal of claim 1,
wherein the contact section comprises an elastic arm extending between the support section and the second contact portion, and
wherein the elastic arm comprises two inverse U-shaped slots defined therein to extend vertically from an outer periphery of the elastic arm.

8. The contact terminal of claim 1,
wherein the contact section comprises:
a first arm extending between the second contact portion and the support section, and
a second arm extending between the second contact portion and a portion of the first arm,
wherein an opening is formed between the fist art and the second arm, and
wherein a U-shaped slot is formed between the second arm and the support section.

9. An electrical connection testing apparatus, comprising
an axle having an axis and made of elastically and torsionally deformable material about the axis;
a circuit substrate having an electric contact formed thereon; and
a contact terminal made of electrically conductive material and securely mounted on the axle,
wherein the contact terminal comprises a first contact portion and a second contact portion,
wherein the first contact portion is positioned opposite the electric contact of the circuit substrate with a gap formed there between,
wherein, when a testing element is forced on the second contact portion, the contact terminal swings about the axis of the axle by an elastic deformation of the axle, causing the first contact portion to make contact with the electric contact of the circuit substrate, thereby electrically connecting the testing element and the electric contact of the circuit substrate through the contact terminal.

\* \* \* \* \*